(12) United States Patent
Guyader et al.

(10) Patent No.: US 9,998,699 B2
(45) Date of Patent: Jun. 12, 2018

(54) BACK-ILLUMINATED GLOBAL-SHUTTER IMAGE SENSOR

(71) Applicant: STMICROELECTRONICS (CROLLES 2) SAS, Crolles (FR)

(72) Inventors: François Guyader, Montbonnot (FR); François Roy, Seyssins (FR)

(73) Assignee: STMicroelectronics (Crolles 2) SAS, Crolles (FR)

( * ) Notice: Subject to any disclaimer, the term of this patent is extended or adjusted under 35 U.S.C. 154(b) by 39 days.

(21) Appl. No.: 15/077,023

(22) Filed: Mar. 22, 2016

(65) Prior Publication Data
US 2017/0134683 A1 May 11, 2017

(30) Foreign Application Priority Data

Nov. 9, 2015 (FR) ..................... 15 60701

(51) Int. Cl.
| | |
|---|---|
| *H04N 3/14* | (2006.01) |
| *H04N 5/335* | (2011.01) |
| *H04N 5/374* | (2011.01) |
| *H04N 5/353* | (2011.01) |
| *H04N 5/378* | (2011.01) |
| *H01L 27/146* | (2006.01) |

(52) U.S. Cl.
CPC ....... *H04N 5/3742* (2013.01); *H01L 27/1463* (2013.01); *H01L 27/1464* (2013.01); *H01L 27/14614* (2013.01); *H01L 27/14623* (2013.01); *H01L 27/14629* (2013.01); *H01L 27/14634* (2013.01); *H04N 5/353* (2013.01); *H04N 5/378* (2013.01); *H01L 27/14643* (2013.01)

(58) Field of Classification Search
CPC .......... H01L 27/1464; H01L 27/14643; H01L 27/14636; H04N 5/374; H04N 5/378; G02B 5/201

See application file for complete search history.

(56) References Cited

U.S. PATENT DOCUMENTS

| | | | | |
|---|---|---|---|---|
| 8,748,945 B2* | 6/2014 | Shin | .................. | H01L 27/14607 257/219 |
| 9,236,407 B2 | 1/2016 | Roy et al. | | |
| 9,318,520 B2* | 4/2016 | Fujii | ................. | H01L 27/14609 |
| 9,842,871 B2* | 12/2017 | Yamaguchi | ......... | H01L 27/1461 |
| 2002/0154236 A1* | 10/2002 | Sakurai | .................. | H04N 5/361 348/312 |
| 2004/0115339 A1* | 6/2004 | Ito | .......................... | G02B 5/201 427/66 |
| 2004/0135063 A1* | 7/2004 | Dosluoglu | ........ | H01L 27/14603 250/208.1 |
| 2005/0082630 A1* | 4/2005 | Yamanaka | .......... | H01L 27/1446 257/461 |

(Continued)

FOREIGN PATENT DOCUMENTS

EP 2674976 12/2013

*Primary Examiner* — Chia-Wei A Chen
(74) *Attorney, Agent, or Firm* — Slater Matsil, LLP

(57) ABSTRACT

A global shutter image sensor of a back-illuminated type includes a semiconductor substrate and pixels. Each pixel includes a photosensitive area, a storage area, a readout area and areas for transferring charges between these different areas. The image sensor includes, for each pixel, a protector extending at least partly into the substrate from the back of the substrate to ensure that the storage area is protected against back illumination.

25 Claims, 3 Drawing Sheets

(56) References Cited

U.S. PATENT DOCUMENTS

| | | | |
|---|---|---|---|
| 2008/0203452 A1* | 8/2008 | Moon | H01L 27/14603 257/292 |
| 2009/0179232 A1* | 7/2009 | Adkisson | H01L 27/14603 257/229 |
| 2010/0118172 A1* | 5/2010 | McCarten | H01L 27/14621 348/302 |
| 2010/0237451 A1 | 9/2010 | Murakoshi | |
| 2011/0226934 A1* | 9/2011 | Tian | H01L 27/14603 250/208.1 |
| 2012/0019695 A1* | 1/2012 | Qian | H01L 27/14621 348/273 |
| 2012/0248580 A1* | 10/2012 | Matsugai | H01L 22/12 257/621 |
| 2013/0070131 A1 | 3/2013 | Ohkubo et al. | |
| 2013/0207214 A1* | 8/2013 | Haddad | H01L 31/0236 257/432 |
| 2013/0334637 A1 | 12/2013 | Wang et al. | |
| 2014/0078359 A1* | 3/2014 | Lenchenkov | H01L 27/14627 348/294 |
| 2014/0131779 A1 | 5/2014 | Takeda | |
| 2014/0151531 A1* | 6/2014 | Yamashita | H01L 27/14607 250/208.1 |
| 2014/0197301 A1* | 7/2014 | Velichko | H01L 27/14625 250/208.1 |
| 2014/0327051 A1 | 11/2014 | Ahn et al. | |
| 2014/0346572 A1* | 11/2014 | Chen | H01L 27/14806 257/229 |
| 2015/0054110 A1* | 2/2015 | Kashihara | H01L 27/14636 257/435 |
| 2015/0091114 A1 | 4/2015 | Mansoorian et al. | |
| 2015/0179691 A1* | 6/2015 | Yanagita | H01L 27/14634 257/292 |
| 2015/0372038 A1* | 12/2015 | Lee | H01L 27/14643 348/294 |
| 2016/0118438 A1* | 4/2016 | Leung | H01L 27/14609 257/229 |
| 2016/0211306 A1* | 7/2016 | Choi | H01L 27/14638 |
| 2016/0218125 A1* | 7/2016 | Yamaguchi | H01L 27/1461 |
| 2016/0225815 A1* | 8/2016 | Um | H01L 27/14818 |
| 2016/0276380 A1* | 9/2016 | Yang | H01L 27/14629 |
| 2016/0315115 A1* | 10/2016 | Izuha | H04N 9/045 |
| 2016/0358966 A1* | 12/2016 | Borthakur | H01L 27/14634 |
| 2017/0005121 A1* | 1/2017 | Lenchenkov | H01L 27/1463 |
| 2017/0040375 A1* | 2/2017 | Kirby | H01L 27/14625 |
| 2017/0117315 A1* | 4/2017 | Chen | H01L 27/14629 |
| 2017/0133421 A1* | 5/2017 | Kobayashi | H01L 27/14623 |
| 2017/0134670 A1* | 5/2017 | Chao | H04N 5/332 |
| 2017/0186804 A1* | 6/2017 | Takeuchi | H01L 31/1105 |

* cited by examiner

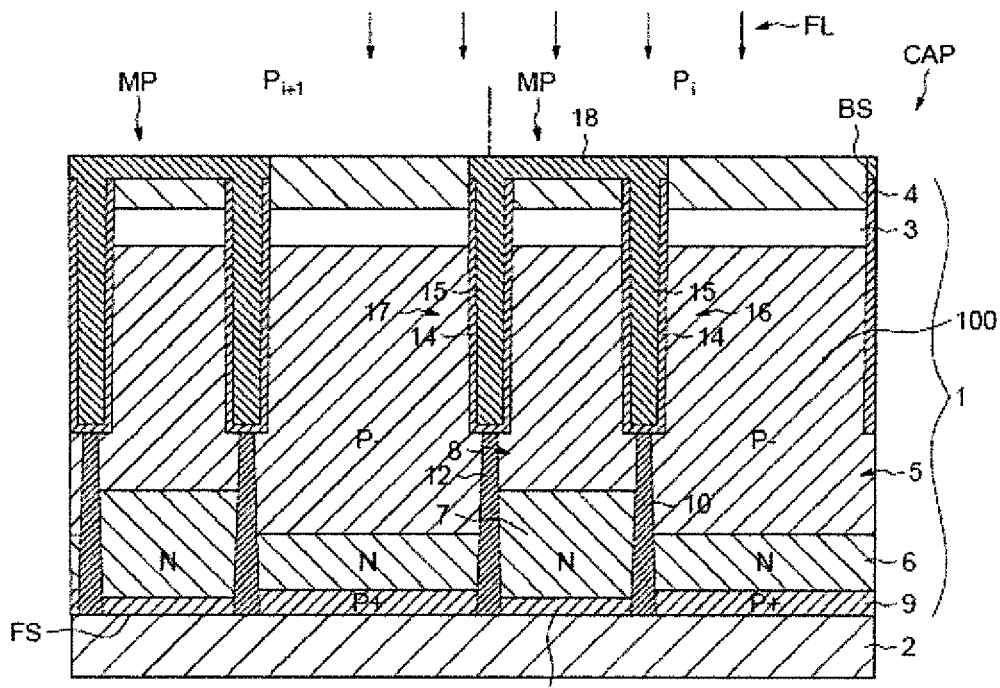
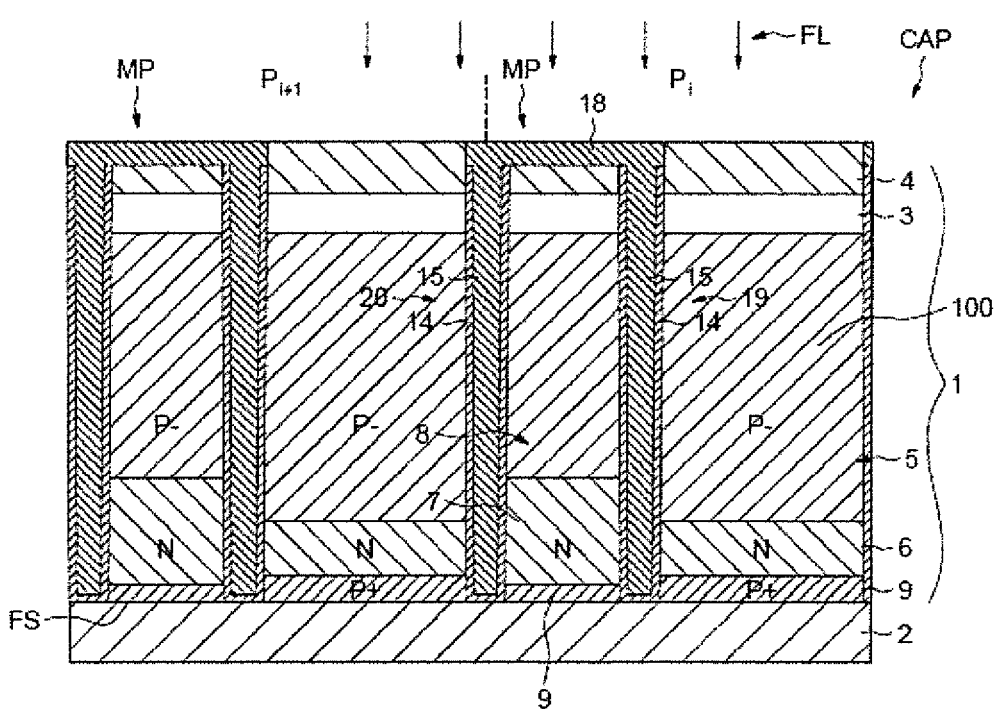

BACK-ILLUMINATED GLOBAL-SHUTTER IMAGE SENSOR

FIELD OF THE INVENTION

The present invention relate to image sensors, and in particular, to a global-shutter image sensor.

BACKGROUND

In a global-shutter image sensor all of the pixels are exposed simultaneously. This enables the capture of clearer images, notably when capturing moving objects.

A global-shutter sensor conventionally comprises a set of pixels, with each pixel comprising a photosensitive area, a storage area and a readout area. When the sensor is illuminated, electrons are generated and accumulate in the photosensitive area. A control circuit allows the simultaneous passage of the electrons from the photosensitive area to the storage area, then to the readout area. A non-limiting example of such a sensor and of its operation is described in published French patent application FR3000606.

Front-illuminated global-shutter image sensors exist but are difficult to integrate in three-dimensional integrated structures, notably due to the necessity to make the storage area opaque to minimize or reduce noise.

SUMMARY

According to one embodiment, a back-illuminated global-shutter image sensor integrated in a three-dimensional integrated structure is provided.

The integrated image sensor may be adapted to a control mode known as a global shutter, and comprises a semiconductor substrate and a plurality of pixels. Each pixel may comprise a photosensitive area, a storage area, a readout area and areas for transferring charges between these different areas.

The sensor may be of the back-illuminated type and may further comprise, for each pixel, protection means or a protector extending at least partly into the substrate from its back and configured to ensure that the storage area is protected against back illumination.

The protectors may take different forms. In certain cases they can be passive or active in the sense that they then carry out a transfer gate function. Furthermore, the protectors may also serve as light guides, notably for infrared radiation.

According to a first variation in which the protectors are passive, the storage area may be at least partially delimited by at least one first and second insulated vertical electrodes which extend from the front of the substrate. The first electrode may include a space corresponding to a first area for transferring charges between the photosensitive area and the storage area.

In this first variation, the protectors may, for example, comprise a single capacitive insulation trench which extends from the back into the elongation of the at least first and second insulated vertical electrodes to cover the storage area.

According to another variation, the protectors may comprise at least one first and second capacitive insulation trenches which extend into the substrate from its back, respectively opposite at least the first and second vertical electrodes. A screen may extend on the back of the substrate between the two trenches to cover the storage area.

To ensure a better optical insulation of the storage area, the protectors may non-electrically touch the first and the second insulated vertical electrodes. This notably makes it possible to limit still further the optical crosstalk phenomena familiar to the person skilled in the art.

It is also possible to leave a space between the protectors and the first and second insulated vertical electrodes. For example, the space may be on the order of 0.4 micrometers. According to another variation, part of the protectors may be active, i.e., each protector may comprise insulated vertical electrodes with an area for transferring charges.

In other words, the protectors ensure, in this case, on the one hand a function for protecting the storage area against the illumination from the back, and on the other hand, in the vicinity of the front, a function of insulated vertical electrodes which, with a suitable polarization, will ensure a charge-transfer function.

More specifically, according to one embodiment, the protectors may comprise at least one first and second capacitive insulation trenches extending into the substrate from its back and at least partially delimiting the storage area and forming, in the storage area, first and second insulated vertical electrodes. The first insulated vertical electrode may include a space corresponding to a first area for transferring charges between the photosensitive area and the storage area.

The protectors may also comprise a protection screen extending on the back of the substrate between the at least one first and second capacitive insulation trenches to cover the storage area. The capacitive insulation trenches may each extend up to the front of the substrate. This notably makes it possible, during a step for producing the trenches, to use, for example, the PMD (Pre-Metal Dielectric) dielectric layer of the BEOL portion located on the front of the substrate as an etch-stop layer.

The capacitive insulation trenches may also extend up to a localized implanted area located in the vicinity of the front of the substrate. This makes it possible to leave a space between the end of the trenches and the front of the substrate for potential implementation of components under the capacitive insulation trenches.

The protectors may comprise metal. Thus, the storage area may also be protected against infrared light rays. The insulation trenches may delimit the storage areas of two adjacent pixels while forming a waveguide for infrared rays reaching the photosensitive area of the pixel.

The image sensor may further comprise a control circuit adapted for applying control signals to the insulated vertical electrodes. Thus, by polarizing the electrodes to an adapted potential, it is possible to make the electrons migrate from one region to another.

According to another aspect, a three-dimensional integrated structure is provided. The structure may comprise a first electronic chip comprising an image sensor as described above, and a second electronic chip. The second electronic chip may comprise at least part of the control circuit. The two chips may be connected to one another by hybrid bonding of the metal-metal and insulator-insulator type.

BRIEF DESCRIPTION OF THE DRAWINGS

Other advantages and features of the invention will become apparent upon examining the detailed description of embodiments, which are in no way limiting, and the appended drawings, in which:

FIGS. 1 to 6 illustrate embodiments of the invention.

DETAILED DESCRIPTION

Figure 1:
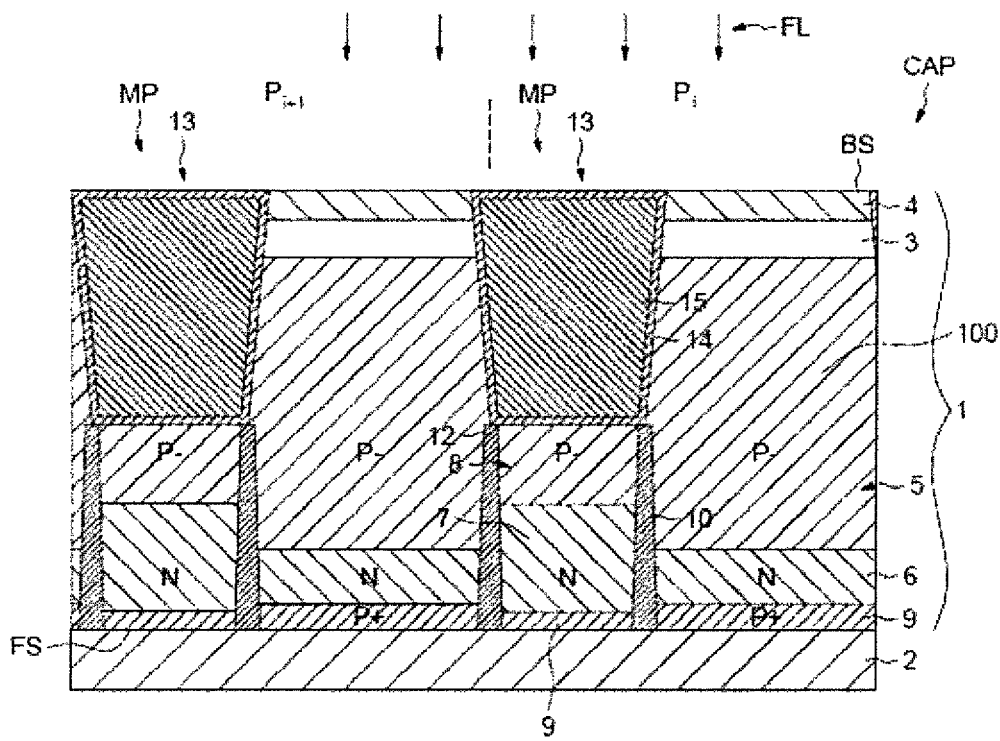

FIG. 1 is a cross-sectional representation of a global-illumination image sensor according to one embodiment.

The image sensor CAP comprises a substrate 1 comprising a semiconductive region 100 with weak p-type doping.

The front FS of the substrate is surmounted (i.e., placed on top) by an interconnect region 2, commonly known to the person skilled in the art by the acronym BEOL (Back End Of Line). The interconnect region 2 is shown in part for the sake of simplification.

The substrate 1 furthermore comprises, on its back BS, an anti-reflective layer 3, surmounted by a layer 4 acting, as will be seen below, as a hardmask for the production of capacitive insulation trenches. The layer 4, for example, may be silicon nitride.

A pixel matrix has been produced in the substrate. Although the sensor comprises numerous pixels, only two identical and juxtaposed pixels $P_i$ and $P_{i+1}$ have been shown here for the sake of simplification.

Each pixel comprises a photosensitive area 5 comprising the stack of the semiconductive region 100, a first region 6 with n-type doping and a layer 9 with $p^+$-type doping, extending from the front of the substrate 1, forming a PNP photodiode. A storage area 8 is for storing charges, which is formed by the stack of the semiconductive region 100, of a second region 7 with n-type doping and of the layer 9. Each pixel also comprises a readout area 26, not shown in the sectional view of FIG. 1 but shown diagrammatically in FIG. 2.

Figure 2:
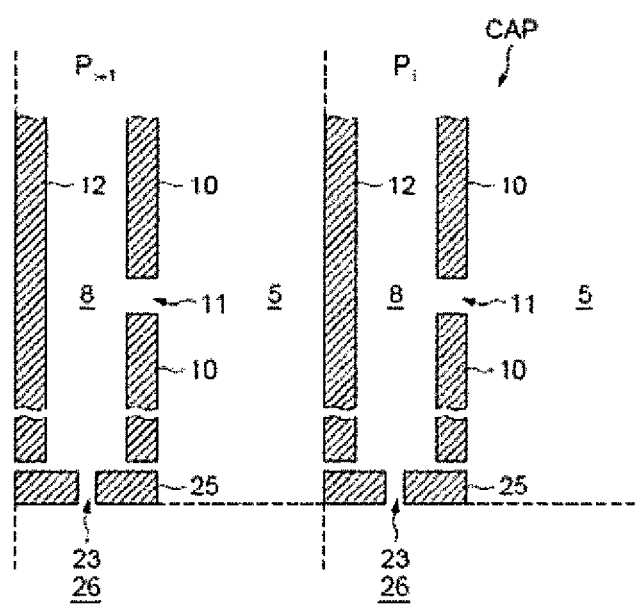

FIG. 2 is a highly diagrammatic top view of an exemplary layout for a photodiode and a storage area. It should be noted that this is only an example and that any other layout is conceivable. A first space corresponding to a first transfer gate 11 is located between the photodiode and the storage area. A second space corresponding to a second transfer gate 23 is located between the storage area and the readout area.

The storage area 8 is delimited by a first insulated vertical electrode 10, a second insulated vertical electrode 12 and a third insulated vertical electrode 25 (not shown in FIG. 1 for the sake of simplification). Each of the electrodes 10, 12 and 25 extend into the substrate from its front.

In this example, the depths of the electrodes are greater than the depths of the first and second implanted regions 6 and 7. For example, the electrodes extend into the substrate to a depth of 4 micrometers. The photodiode 5 (photosensitive area) is, in this example, notably delimited by the first electrode 10 of the storage area of the pixel $P_{i+1}$, and by the second electrode 12 of the pixel $P_i$.

The first electrode 10 includes the space 11 which divides the first electrode 10 into two portions and which forms the first transfer gate. The third electrode 25 includes the space 23 which divides the third electrode 25 into two portions and which forms the second transfer gate.

The operation of such a sensor is briefly provided below. Initially, the substrate is fixed to a reference potential, for example, to ground, and the three electrodes 10, 12 and 25 to a potential below the reference potential. This causes an accumulation of holes along the walls of the electrodes, and thereby creates a potential barrier in the transfer area 11. The barrier blocks the exchanges of electrons between the photosensitive area 5 and the storage area 8. The barrier also creates a potential barrier in the transfer area 23 by blocking the exchanges of electrons between the storage area and the readout area. When the photodiode is illuminated, electron-hole pairs are photogenerated in the photodiode and the electrons are accumulated in the region 6.

Next, during a first transfer phase, the two portions of the first electrode 10 are polarized to the same first potential above the reference potential, for example, a potential of 2 volts. This causes the transfer of all of the accumulated electrons from the region 6 to the region 7 of the storage area 8, via the transfer gate 11. Once the transfer has been made, the first electrode 10 is once again polarized to the reference potential to keep the electrons in the region 7 of the storage area 8.

Then, during a second transfer phase, a second potential above the reference potential, for example, a potential of 2 volts, is applied to the two portions of the third electrode 25. This causes the transfer, via the transfer gate 23, of all of the stored electrons from the region 7 to the readout area 26. Here the value of the pixel will be read out by a readout circuit, which is not shown in the diagram for the sake of simplification.

In FIG. 1, the image sensor CAP is back illuminated. When the sensor is illuminated, the luminous flux FL therefore reaches the back BS of the substrate. Each storage area 8 should therefore be protected from the light to avoid unwanted signals as much as possible. Thus, in this example, each storage area 8 is protected from the light by protection means or protector MP.

In this embodiment, the protector MP for the pixel $P_i$ comprise a single capacitive insulation trench 13 which extends from the back of the substrate opposite the three electrodes 10, 12 and 25. This is to cover the storage areas and partially delimit the photodiodes 5 of the pixels $P_i$ and $P_{i+1}$.

In this example, the walls of the capacitive insulation trenches 13 are covered by an insulating material 14, for example, silicon oxide. The trenches are filled with a metallic material 15, for example, copper.

It should be noted that not only does the capacitive insulation trench 13 totally cover the storage area 8, but it additionally touches the three electrodes 10, 12 and 25, yet without being in electrical contact therewith. This contact is made by the insulating material 14 of the capacitive insulation trench.

However, to avoid any risk of electrical contact during the production of the trenches, provision can be made to leave a space between the capacitive insulation trench 13 and the electrodes 10, 12 and 25. For example, a space of 0.4 micrometer may be left. The trench can, for example, extend into the substrate to a depth of 2 to 16 micrometers.

The capacitive insulation trench 13 is adapted to be polarized to a third potential below the reference potential, for example, −3 volts. This is notably to limit the dark current. The capacitive insulation trenches of the image sensor are passive, i.e., they do not act as transfer electrodes. However, they do form waveguides for infrared rays.

FIG. 3 illustrates an embodiment in which the protector MP for the pixel Pi comprises a first capacitive trench 16 extending from the back of the substrate 1 opposite the first electrode 10, a second capacitive insulation trench 17 extending from the back of the substrate 1 opposite the second electrode 12, and a third capacitive insulation trench, not shown in FIG. 3, extending from the back of the substrate 1 opposite the third insulated vertical electrode 25.

Each capacitive insulation trench extends into the substrate over a length of 2 to 16 micrometers and is in mechanical contact, without being in electrical contact, with the electrode facing it. Each capacitive insulation trench also comprises an insulating layer 14 of silicon oxide and a copper filling 15. Once again, it would be possible to leave a space on the order of 0.4 micrometers between each capacitive insulation trench and the electrode facing it.

The protector furthermore comprises an opaque screen 18, for example, metallic, which extends from the back of the substrate 1 to cover the storage area 8 completely. The screen 18 is in contact with the two capacitive insulation trenches 16 and 17, and with the third capacitive insulation trench.

The insulation trenches 16 and 17, the third insulation trench and the opaque screen may be produced during the same process step, for example, a process known as dual-damascene that is familiar to the person skilled in the art, and therefore comprises the same material. In this example, the trenches 16 and 17, as well as the opaque screen 18, comprise the same metal 15, such as copper, for example.

Once again, the capacitive insulation trenches 16 and 17 and the third capacitive insulation trench are adapted to be polarized to a potential below the reference potential, for example, −3 volts. This is notably in order to limit the dark current. Once again, the capacitive insulation trenches 16 and 17 form waveguides, notably for infrared rays.

FIG. 4 illustrates an embodiment in which the protector MP comprises the insulated vertical electrodes. In this embodiment, the protector MP for the pixel $P_i$ comprises a first capacitive trench 19, a second capacitive insulation trench 20, a third capacitive insulation trench, and an opaque protection screen 18.

The first capacitive trench 19 extends into the substrate from its back to its front. This is between the photosensitive area 5 and the storage area 8.

The second capacitive insulation trench 20 extends into the substrate from its back to its front. This is between the storage area 8 and the photosensitive area of the neighboring pixel.

Figure 5:
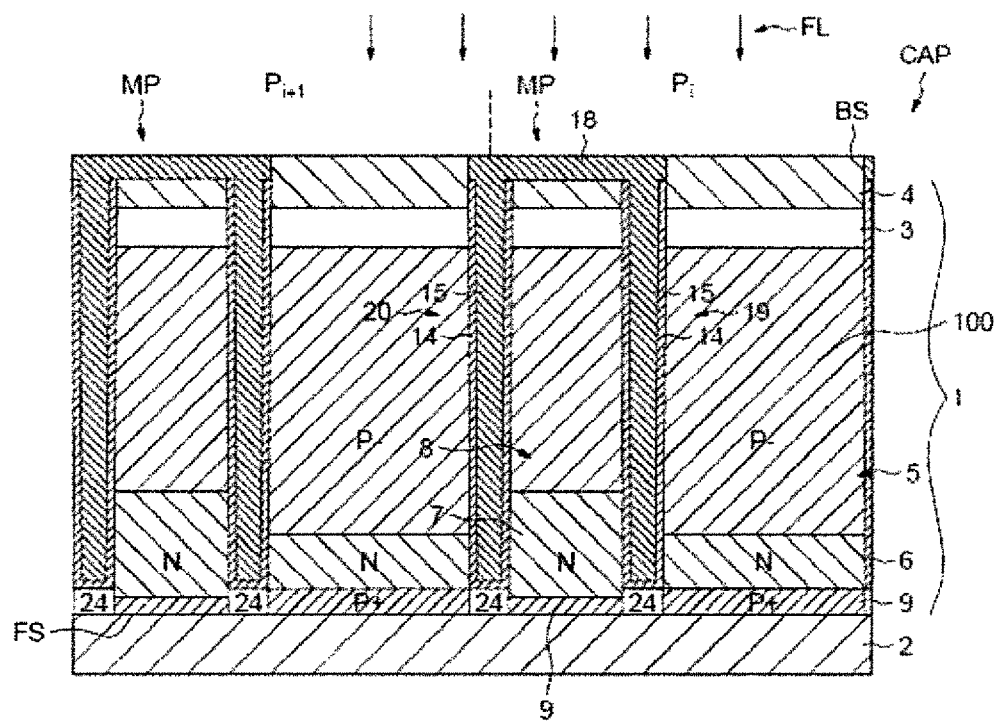

The third capacitive insulation trench, not shown in FIG. 5, extends into the substrate from its back to its front, between the storage area 8 and the readout area 26. The three capacitive insulation trenches thereby delimit the storage area 8.

The opaque protection screen 18 extends on the back BS of the substrate between the two capacitive insulation trenches 19 and 20 to cover the storage area 8. The first capacitive insulation trench 19 includes a space in its lower part. This corresponds to the gate for transferring charges 11 between the photosensitive area 5 and the storage area 8.

The third capacitive insulation trench (not shown) also includes a space in its lower part. This corresponds to the gate for transferring charges 23 between the storage area 8 and the readout area 26. The first capacitive trench 19 and the third capacitive trench are active, i.e., they act as charge-transfer gates in their lower parts. The second capacitive insulation trench 20 is passive here.

According to another embodiment, illustrated in FIG. 5, the front of the substrate furthermore comprises localized implanted areas 24 located on both sides of each storage area 8. The capacitive insulation trenches each extend up to an implanted area 24. These implanted areas 24 can accommodate electronic components, for example, transistors.

To produce a sensor as described above, a semiconductor substrate is taken as the starting point. On its front the various implanted areas of the various pixels are produced, as well as the electrodes 10, 12 and 25 (FIGS. 1 and 3). Then the interconnect portion (BEOL) on the front of the substrate is produced.

Next, the substrate is turned over and the substrate is thinned from its back. Next, the protectors MP are produced by etching and filling with metal, according to one of the embodiments described previously and illustrated in FIGS. 1 to 5. In the case of FIGS. 4 and 5, the capacitive insulation trenches of the protectors MP also form the vertical electrodes.

Figure 6:
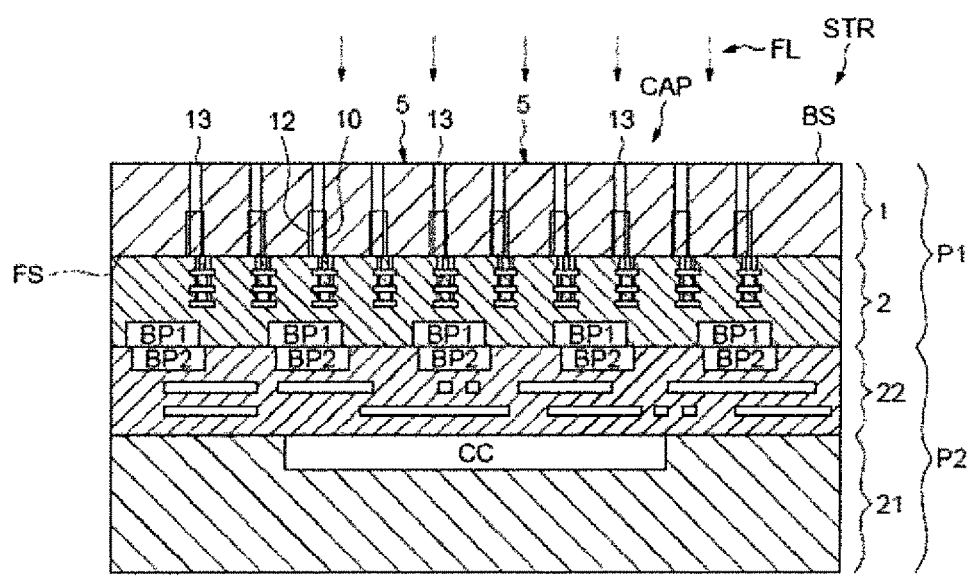

FIG. 6 illustrates an embodiment in which an image sensor CAP according to the embodiment described previously and illustrated in FIG. 1 has been integrated in a three-dimensional integrated structure STR. The integrated structure STR comprises a first chip P1 comprising the sensor CAP, and a second chip P2 comprising a control logic circuit, for example.

The first chip P1 comprises a plurality of pixels $P_i$, $P_{i+1}$, $P_{i+2}$, etc. Each pixel comprises a photosensitive area 5 and a memory area 8 protected by the single capacitive insulation trench 13. The interconnect portion of the first chip P1 comprises first bonding pads BP1 which comprise copper and which extend from its front.

The second chip P2 comprises a semiconductor substrate 21, surmounted by an interconnect region 22. The interconnect region 22 of the second chip P2 comprises metal levels and vias which between them connect the various electronic components of the second chip P2, as well as bonding pads BP2 comprising copper located on its front.

The two chips P1 and P2 are joined to one another by hybrid bonding. The hybrid bonding may be metal-metal and insulator-insulator. The control circuit CC intended to control the sensor and notably to polarize the various electrodes is located in the substrate of the chip P2.

It would also be possible for the control circuit CC to be located partly in the chip P2 and partly in the chip P1, or even entirely in the chip P1. Similarly, the chip P2 could be a simple support, known to the person skilled in the art by the term interposer.

Although a three-dimensional integrated structure STR comprising an image sensor according to the embodiment described in FIG. 1 has been described, such a structure is compatible with the other embodiments described previously.

Furthermore, although capacitive insulation trenches comprising copper have been described, the embodiments described previously are compatible with any type of metal, notably tungsten. Tungsten can advantageously be used for filling trenches with a very large aspect ratio (i.e., the ratio of height to width).

That which is claimed is:

1. A back-illuminated image sensor comprising:
a semiconductor substrate; and
a plurality of pixels in the semiconductor substrate, each pixel comprising
a photosensitive area,
a storage area,
a readout area,
areas for transferring charges between the photosensitive, storage and readout areas, and
a protector extending at least partly into the semiconductor substrate from a back of the semiconductor substrate, the protector configured to protect the storage area against back illumination, wherein each pixel further comprises spaced apart first and second insulated vertical electrodes which extend from a front of the semiconductor substrate to at least partially delimit the storage area, the first insulated vertical electrode including a space corresponding to a first area for transferring charges between the photosensitive area and the storage area, and wherein the protector comprises:
spaced apart first and second capacitive insulation trenches which extend into the semiconductor substrate from a back of the semiconductor substrate, respectively opposite the first and second insulated vertical electrodes, and a screen extending on the back of the semiconductor substrate between the spaced apart first and second capacitive insulation trenches to cover the storage area.

2. The back-illuminated image sensor according to claim 1, wherein the protector non-electrically contacts the first and second insulated vertical electrodes.

3. The back-illuminated image sensor according to claim 1, wherein the protector comprises metal.

4. The back-illuminated image sensor according to claim 1, further comprising a control circuit configured to apply control signals to the first and second insulated vertical electrodes.

5. The back-illuminated image sensor according to claim 1, wherein the semiconductor substrate and the plurality of pixels in the semiconductor substrate are configured so that the back-illuminated image sensor is a back-illuminated global shutter image sensor.

6. The back-illuminated image sensor according to claim 1, wherein the first and second insulated vertical electrodes are in direct contact with a portion of the storage area.

7. The back-illuminated image sensor according to claim 1, wherein the semiconductor substrate comprises an anti-reflective layer, and wherein the protector extends at least partly into the semiconductor substrate from a back of the semiconductor substrate—and through the anti-reflective layer.

8. A back-illuminated image sensor comprising:
a semiconductor substrate; and
a plurality of pixels in the semiconductor substrate, each pixel comprising
a photosensitive area,
a storage area,
a readout area,
areas for transferring charges between the photosensitive, storage and readout areas, and
a protector extending at least partly into the semiconductor substrate from a back of the semiconductor substrate and configured to protect the storage area against back illumination, wherein the protector comprises:
spaced apart first and second capacitive insulation trenches extending into the semiconductor substrate from a back of the semiconductor substrate to at least partially delimit the storage area and forming, in the storage area, spaced apart first and second insulated vertical electrodes,
the first insulated vertical electrode including a space corresponding to a first area for transferring charges between the photosensitive area and the storage area; and
the protector comprising a screen extending on the back of the semiconductor substrate between the first and second capacitive insulation trenches to cover the storage area.

9. The back-illuminated image sensor according to claim 8, wherein the first and second capacitive insulation trenches extend from the back of the semiconductor substrate to a front of the semiconductor substrate.

10. The back-illuminated image sensor according to claim 8, wherein the semiconductor substrate comprises on a front thereof, for each pixel, spaced apart implanted areas; and wherein the first and second capacitive insulation trenches extend from the back of the semiconductor substrate to the spaced apart implanted areas.

11. The back-illuminated image sensor according to claim 8, wherein the semiconductor substrate comprises an anti-reflective layer, and wherein the protector extends at least partly into the semiconductor substrate from a back of the semiconductor substrate—and through the anti-reflective layer.

12. A three-dimensional integrated structure comprising:
a first electronic chip comprising a back-illuminated global shutter image sensor comprising
a semiconductor substrate,
a plurality of pixels in the semiconductor substrate, each pixel comprising
a photosensitive area,
a storage area,
a readout area,
areas for transferring charges between the photosensitive, storage and readout areas, and
a protector extending at least partly into the semiconductor substrate from a back of the semiconductor substrate, the protector configured to protect the storage area against back illumination; and
a second electronic chip comprising a control circuit for applying control signals to the back-illuminated global shutter image sensor, wherein the first and second electronic chips are joined together, wherein each pixel further comprises spaced apart first and second insulated vertical electrodes which extend from a front of the semiconductor substrate to at least partially delimit the storage area, the insulated vertical first electrode including a space corresponding to a first area for transferring charges between the photosensitive area and the storage area, and wherein the protector comprises:
spaced apart first and second capacitive insulation trenches which extend into the semiconductor substrate from a back of the semiconductor substrate, respectively opposite the first and second insulated vertical electrodes, and
a screen extending on the back of the semiconductor substrate between the spaced apart first and second capacitive insulation trenches to cover the storage area.

13. The three-dimensional integrated structure according to claim 12, wherein the first and second electronic chips are joined together via hybrid bonding, with the hybrid bonding comprising at least one of metal-metal and insulator-insulator type bonding.

14. The three-dimensional integrated structure according to claim 12, wherein the protector non-electrically contacts the first and second insulated vertical electrodes.

15. The three-dimensional integrated structure according to claim 12, wherein the semiconductor substrate comprises an anti-reflective layer, and wherein the protector extends at least partly into the semiconductor substrate from a back of the semiconductor substrate—and through the anti-reflective layer.

16. A three-dimensional integrated structure comprising:
a first electronic chip comprising a back-illuminated global shutter image sensor comprising
a semiconductor substrate,
a plurality of pixels in the semiconductor substrate, each pixel comprising
a photosensitive area,
a storage area,
a readout area,
areas for transferring charges between the photosensitive, storage and readout areas, and
a protector extending at least partly into the semiconductor substrate from a back of the semiconductor substrate, the protector configured to protect the storage area against back illumination; and a second electronic chip comprising a control circuit for applying control signals to the back-illuminated global shutter image sensor, wherein the first and second electronic chips are joined together, wherein the protector comprises:

spaced apart first and second capacitive insulation trenches extending into the semiconductor substrate from a back of the semiconductor substrate to at least partially delimit the storage area and forming, in the storage area, spaced apart first and second insulated vertical electrodes, the first insulated vertical electrode including a space corresponding to a first area for transferring charges between the photosensitive area and the storage area, and the protector comprising a screen extending on the back of the semiconductor substrate between the first and second capacitive insulation trenches to cover the storage area.

17. The three-dimensional integrated structure according to claim 16, wherein the first and second capacitive insulation trenches extend from the back of the semiconductor substrate to a front of the semiconductor substrate.

18. The three-dimensional integrated structure according to claim 16, wherein the semiconductor substrate comprises on a front thereof, for each pixel, spaced apart implanted areas; and wherein the first and second capacitive insulation trenches extend from the back of the semiconductor substrate to the spaced apart implanted areas.

19. The three-dimensional integrated structure according to claim 16, wherein the semiconductor substrate comprises an anti-reflective layer, and wherein the protector extends at least partly into the semiconductor substrate from a back of the semiconductor substrate—and through the anti-reflective layer.

20. A method for protecting global shutter image sensor from back-illumination, the global shutter image sensor comprising a semiconductor substrate, a plurality of pixels in the semiconductor substrate, with each pixel comprising a photosensitive area, a storage area, a readout area, and areas for transferring charges between the photosensitive, storage and readout areas, the method comprising:

forming a protector that extends at least partly into the semiconductor substrate from a back of the semiconductor substrate to protect the storage area against back illumination, wherein each pixel further comprises spaced apart first and second insulated vertical electrodes which extend from a front of the semiconductor substrate to at least partially delimit the storage area, the first insulated vertical electrode including a space corresponding to a first area for transferring charges between the photosensitive area and the storage area, and wherein forming the protector comprises:

forming spaced apart first and second capacitive insulation trenches which extend into the semiconductor substrate from a back of the semiconductor substrate, respectively opposite the first and second insulated vertical electrodes, and forming a screen extending on the back of the semiconductor substrate between the spaced apart first and second capacitive insulation trenches to cover the storage area.

21. The method according to claim 20, wherein the protector non-electrically contacts the first and second insulated vertical electrodes.

22. The method according to claim 20, wherein the semiconductor substrate comprises an anti-reflective layer, and wherein the protector extends at least partly into the semiconductor substrate from a back of the semiconductor substrate—and through the anti-reflective layer.

23. A method for protecting global shutter image sensor from back-illumination, the global shutter image sensor comprising a semiconductor substrate, a plurality of pixels in the semiconductor substrate, with each pixel comprising a photosensitive area, a storage area, a readout area, and areas for transferring charges between the photosensitive, storage and readout areas, the method comprising:

forming a protector that extends at least partly into the semiconductor substrate from a back of the semiconductor substrate to protect the storage area against back illumination, wherein forming the protector comprises:

forming spaced apart first and second capacitive insulation trenches extending into the semiconductor substrate from a back of the semiconductor substrate to at least partially delimit the storage area and forming, in the storage area, spaced apart first and second insulated vertical electrodes, the first insulated vertical electrode including a space corresponding to a first area for transferring charges between the photosensitive area and the storage area; and forming a screen extending on the back of the semiconductor substrate between the first and second capacitive insulation trenches to cover the storage area.

24. The method according to claim 23, wherein the first and second capacitive insulation trenches extend from the back of the semiconductor substrate to a front of the semiconductor substrate.

25. The method according to claim 23, wherein the semiconductor substrate comprises an anti-reflective layer, and wherein the protector extends at least partly into the semiconductor substrate from a back of the semiconductor substrate—and through the anti-reflective layer.

* * * * *